(12) United States Patent
Allmeier

(10) Patent No.: US 6,194,951 B1
(45) Date of Patent: Feb. 27, 2001

(54) METHOD AND DEVICE FOR DIVING AN INTEGRATED POWER OUTPUT STAGE

(75) Inventor: Franz Allmeier, Mintraching (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/527,121

(22) Filed: Mar. 16, 2000

Related U.S. Application Data

(63) Continuation of application No. PCT/DE98/02730, filed on Sep. 15, 1998.

(51) Int. Cl.$^7$ ................................................... H03K 17/74
(52) U.S. Cl. ............................ 327/424; 327/437; 327/170
(58) Field of Search .................................... 327/424, 434, 327/436, 437, 170, 374, 379; 326/87

(56) References Cited

U.S. PATENT DOCUMENTS

| | | |
|---|---|---|
| 4,697,107 * | 9/1987 | Haines ..................................... 326/87 |
| 4,973,865 | 11/1990 | Haq . |
| 5,315,174 | 5/1994 | Chang et al. . |
| 5,438,277 * | 8/1995 | Sharpe-Geisler ........................ 326/87 |
| 5,534,791 * | 7/1996 | Battos et al. ............................ 326/87 |
| 5,568,081 | 10/1996 | Lui et al. . |
| 5,570,259 * | 10/1996 | Allmeier et al. ........................ 361/36 |
| 5,617,051 | 4/1997 | Bingham . |
| 5,739,707 * | 4/1998 | Baraclough ........................... 327/126 |

FOREIGN PATENT DOCUMENTS

| | | |
|---|---|---|
| 0 509 113 A1 | 10/1992 | (EP) . |
| 0 750 112 A2 | 12/1996 | (EP) . |
| 0 788 232 A2 | 8/1997 | (EP) . |

* cited by examiner

*Primary Examiner*—Terry D. Cunningham
(74) *Attorney, Agent, or Firm*—Herbert L. Lerner; Laurence A. Greenberg; Werner H. Stemer

(57) ABSTRACT

A voltage $U_A$ that can be measured at a junction point between a load and a limit switch when the load is disconnected is compared with a predetermined threshold value W. The limit switch is turned on and off with a predetermined current associated with shallow turn-on and turn-off edges when $U_A < W$, or is turned on and off with a higher current associated with steep turn-on and turn-off edges when $U_A > W$.

9 Claims, 3 Drawing Sheets

METHOD AND DEVICE FOR DIVING AN INTEGRATED POWER OUTPUT STAGE

CROSS-REFERENCE TO RELATED APPLICATION

This is a continuation of copending International Application PCT/DE98/02730, filed Sep. 15, 1998, which designated the United States.

BACKGROUND OF THE INVENTION

Field of the Invention

The invention relates to a method for driving an integrated power output stage for switching loads connected to terminals of a voltage source. The invention also relates to a device for carrying out this method.

U.S. Pat. No. 5,315,174 discloses such a device for driving a load using a power output stage, in which a steepness of switching edges of the power transistor connected in series with the load to the terminals of a voltage source can be adjusted, on the basis of external control signals (which can also be stored), to be either steep at first and then shallower, or just shallow.

U.S. Pat. No. 5,568,081 discloses a device for driving a power output stage, in which the steepness of the turn-on and turn-off edges of the power transistors can be adjusted on the basis of external control signals. In addition, during periods of the output signal when the di/dt derivative for output current against time is large, shallow turn-on and turn-off edges can be chosen, and during periods of the output signal when the di/dt derivative for output current against time is small, steep turn-on and turn-off edges can be chosen.

U.S. Pat. No. 5,617,051 discloses a device for limiting voltage overshoot, in which the change or rate of change in the output voltage is measured. If predetermined values are exceeded, the output is fed back to the drive circuit so that the overshoot behavior is reduced as a result of the switching edges being flattened.

Power output stages are used in large numbers particularly in the field of engine control in motor vehicles. Depending on the application, the individual loads are driven sporadically, at a fixed driving frequency or depending on engine speed, with switching times which have to be adhered to more or less exactly. The more precisely the switching times have to be adhered to, the steeper the rising and falling edges required for the output stage switches directly switching the load; for less time-critical applications, freewheeling diodes are connected in parallel with the loads.

If the loads are driven on the basis of engine speed, in which case exact turn-on times, for example for fuel injection or ignition, are usually required, then the interference spectrum produced by the steep edges of the switching signals has a broad bandwidth. Loads driven at a fixed frequency form a fixed interference frequency and are therefore more critical.

Each type of driving for these loads requires specially matched power output stages. The large number of power output stages required results in that integrated multiple drivers are used, e.g. quadruple or octuple drivers, and, in the near future, ICs with even more drivers as a result of higher integration density, which need to be matched to the particular application using external components, at high cost. In this context, it is common practice to make the switching edges of the power switches just as steep as the application requires to keep the radiated interference as low as possible.

SUMMARY OF THE INVENTION

It is accordingly an object of the invention to provide a method and a device for driving an integrated power output stage which overcome the above-mentioned disadvantages of the prior art methods and devices of this general type, which allows the power output stage itself to recognize whether the load which is to be switched needs to be driven with shallow or steep switching edges, and to set itself to this.

With the foregoing and other objects in view there is provided, in accordance with the invention, a method for driving an integrated power output stage having a limit switch for switching a load connected to terminals of a voltage source in series with the limit switch, a control unit generates control signals for driving the integrated power output stage, the method which includes:

measuring a voltage at a junction point between the load and the limit switch if the load is disconnected resulting in a measured voltage;

comparing the measured voltage with a predetermined threshold value resulting in a comparison result;

storing a value associated with the comparison result over a course of operation;

turning on and off the limit switch to have shallow turn-on and turn-off edges with a first predetermined current when the value has a first, low signal level; and turning on and off the limit switch to have steep turn-on and turn-off edges with a second current if the value q has a second, high signal level, the second current being a higher current than the first predetermined current.

In accordance with an added feature of the invention, there is the step of connecting a freewheeling diode between the junction point and a positive terminal of the voltage source for limiting the voltage at the junction point.

With the foregoing and other objects in view there is further provided, in accordance with the invention, in combination with a control unit supplying a control signal and having an on-board voltage supply with a positive terminal and a negative terminal, a device for switching a load, including:

a limit switch having a control input and connected to the load;

a first driver having two driver switches containing a first driver switch and a second driver switch connected in series with each other at a junction point and connected between the positive terminal and the negative terminal of the on-board voltage supply, the driver switches having control inputs receiving the control signal and the junction point of the driver switches is connected to the control input of the limit switch;

a comparator having a first input connected to a junction point between the load and the limit switch, a second input receiving a threshold value, and an output;

an RS flipflop having a Set input connected to the output of the comparator, a Reset input connected to the negative terminal, and an output;

a switching logic circuit having a NAND gate with a first input, a second input, and an output, an AND gate with a first input, a second input, and an output, and an inverter with an input and an output, the output of the RS flipflop connected to the first input of the NAND gate and the first input of the AND gate, and the control signal received by the second input of the AND gate directly and to the second input of the NAND gate via the inverter; and a second driver having two driver switches, containing a first driver switch and a second driver switch connected in series between the positive terminal and the negative terminal of the on-board voltage supply, the first driver switch of the second driver having a control input connected to the output of the NAND gate, the second driver switch of the second driver having a control input connected to the output of the AND gate, and a junction point between the two driver switches of the second driver connected to the control input of the limit switch.

In accordance with an added feature of the invention, the limit switch and the driver switches of the first driver and the second driver are integrated MOSFET switches.

In accordance with another feature of the invention, the first driver switch of the first driver and the first driver switch of the second driver are P-channel MOSFETs, and the limit switch, the second driver switch of the first driver, and the second driver switch of the second driver are N-channel MOSFETs.

In accordance with an additional feature of the invention, there are a plurality of resistors, the driver switches of the first driver and the second driver are bipolar transistors, and each of the bipolar transistors have one of the resistors connected in series with it.

In accordance with a further added feature of the invention, there are a plurality of current sources, the driver switches of the first driver and the second driver are bipolar transistors, and each of the bipolar transistors have one of the current sources connected in series with it.

In accordance with another additional feature of the invention, the control unit has an output delivering an output signal, and the Set input of the RS flipflop is connected to the output of the control unit and receives the output signal.

In accordance with a concomitant feature of the invention, the control unit has outputs supplying driving signals having an amplitude associated with a desired steepness for turn-on and turn-off edges of the limit switch, and the control input of the driver switches of the second driver are directly connected to the outputs of the control unit for receiving the driving signals having the amplitude for controlling the desired steepness for the turn-on and turn-off edges of the limit switch.

Other features which are considered as characteristic for the invention are set forth in the appended claims.

Although the invention is illustrated and described herein as embodied in a method and a device for driving an integrated power output stage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
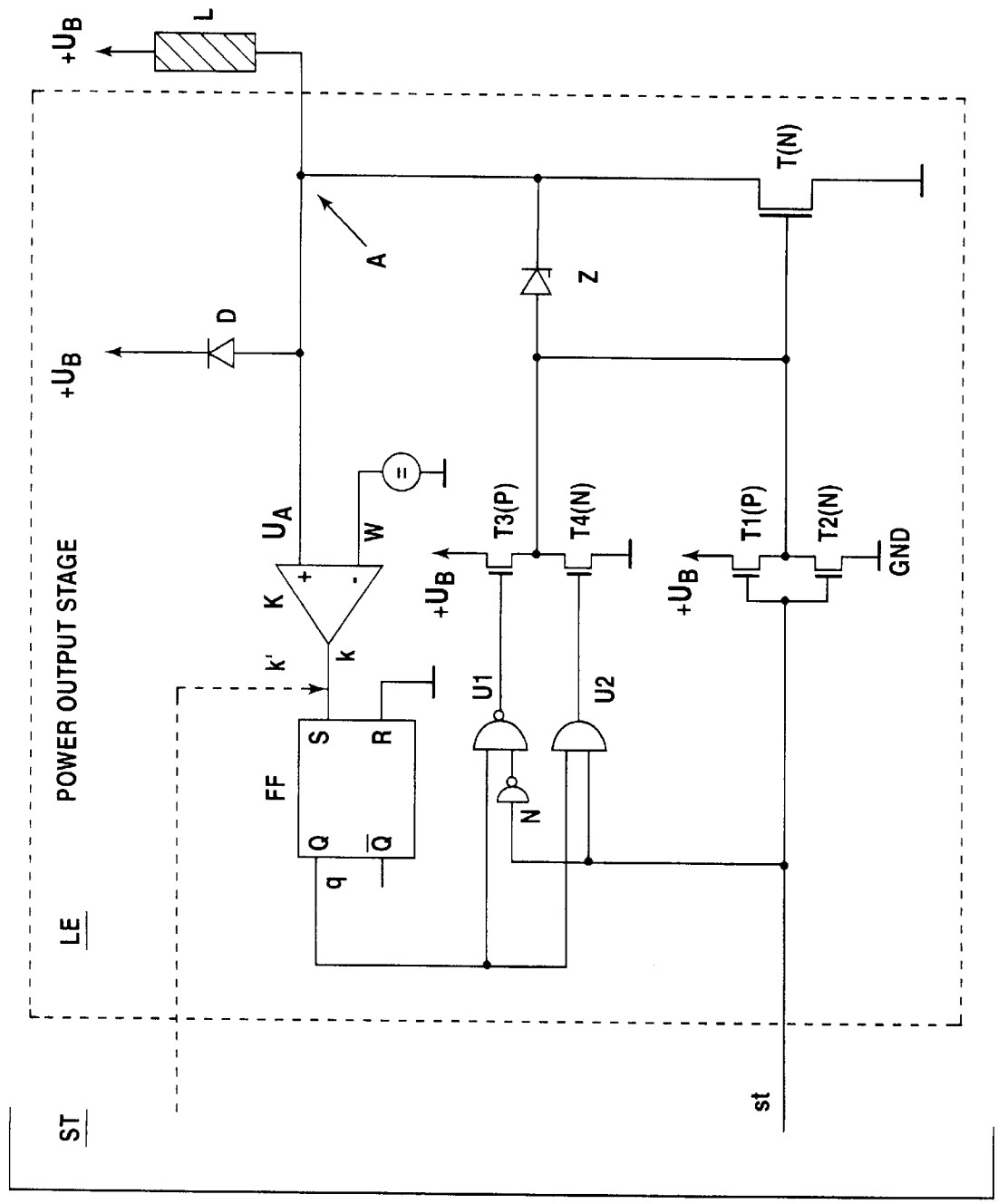
FIG. 1 is a circuit diagram of an integrated power output stage according to the invention.

Referring now to the FIG. 1 of the drawing in detail, there is shown a schematic circuit diagram of an integrated power output stage LE which is disposed within a control unit ST (indicated only) in a dashed box and switches a load L (which is inductive in this illustrative embodiment) via a limit switch T using control signals st from the control unit ST. When the limit switch T is turned on, the load L, which is connected at one end to a positive terminal $+U_B$ of an onboard voltage, is connected to a negative terminal GND, so that virtually the whole on-board voltage is applied to the load. For the sake of simplicity, it is assumed that the on-board voltage $U_B$ is a supply voltage for the control unit ST and for the power output stage at the same time.

For less time-critical applications, a freewheeling diode D is connected in parallel with the load L. In this illustrative embodiment, the freewheeling diode D is presumed to be provided as an integrated component, but its cathode is not connected to the positive terminal $+U_B$ if the load is to be turned on and off with steep edges. The freewheeling diode D can alternatively be provided as an external component.

When the inductive load L is disconnected, the voltage waveforms at a junction point A between the load L and the limit switch T differ according to whether or not the load is being de-energized via the freewheeling diode D. When the load L is disconnected and there is the freewheeling diode D, the voltage $U_A$ at the junction point A, which was near to the negative potential during the turned-on state, rises again to the potential of the on-board voltage $+U_B$, for example +12 V. But when there is no freewheeling diode D for the load L, it rises to a much higher voltage which is limited to the zener voltage $U_Z$, for example +50 V, of an integrated zener diode Z disposed between the control input of the limit switch T and the junction point A, usually to protect the limit switch T. These different values of the disconnection voltage at the junction point A indicate whether the power output stage is to switch the particular inductive load with steep or shallow switching edges.

According to the invention, this voltage measurement is carried out by a comparator K whose one input is connected to the junction point A and whose other input has a predetermined voltage threshold value W of, for example, +30 V applied to it. An output of the comparator K is connected to the Set input S of an RS flipflop FF, whose output Q is at a signal level q=L (low) whenever operation starts.

During the turning-off process after the first driving process for the load L, the voltage $U_A$ either remains below the threshold value W (if the freewheeling diode D is connected in parallel with the load L, the comparator output signal k=L) or it exceeds the threshold value W (if switching takes place with steep edges, with no freewheeling diode D).

In the latter case (steep edges), the RS flipflop FF is set by the output signal k=H (high) from the comparator K, i.e. its output Q is set to a signal level q=H (high); in the other case (shallow edges), the output Q remains at signal level q=L. This value q=L or q=H remains stored in the RS flipflop FF throughout the course of operation.

The control signal st produced in the control unit ST is supplied to control inputs of a first driver, which contains two driver switches T1 and T2 connected in series between the positive terminal $+U_B$ and the negative terminal GND of the onboard voltage.

The output Q of the RS flipflop FF is connected to a switching logic circuit which contains a NAND gate U1, an AND gate U2 and an inverter N and controls the switching speed of the limit switch T on the basis of the signals q and st.

The output Q of the RS flipflop FF is connected to a respective input of the NAND gate U1 and of the AND gate U2. The other input of the AND gate U2 receives the control signal st directly, and the other input of the NAND gate U1 receives it via the inverter N.

Figure 2:
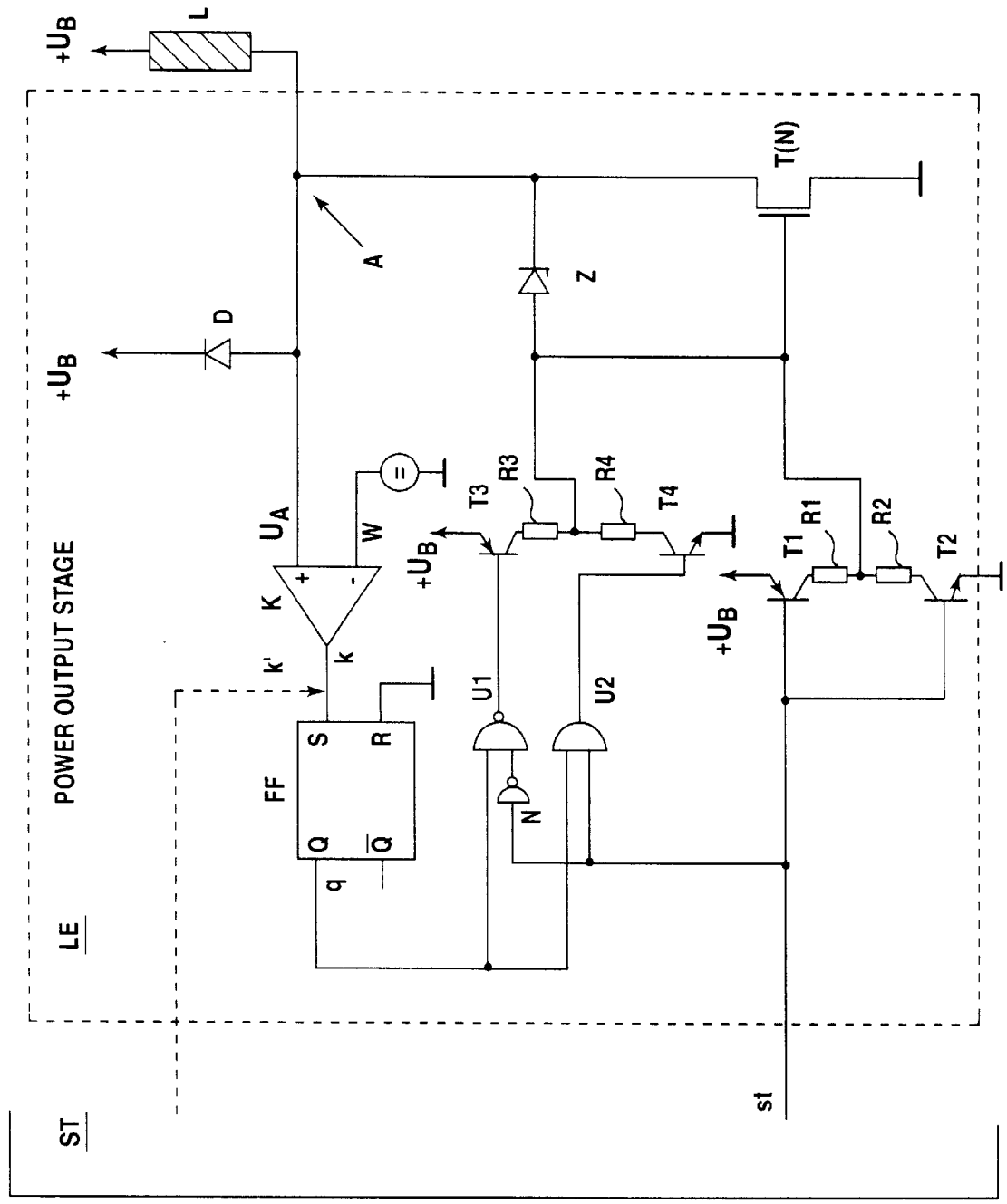
FIG. 2 is a circuit diagram of a second embodiment of the integrated power output stage.
Figure 3:
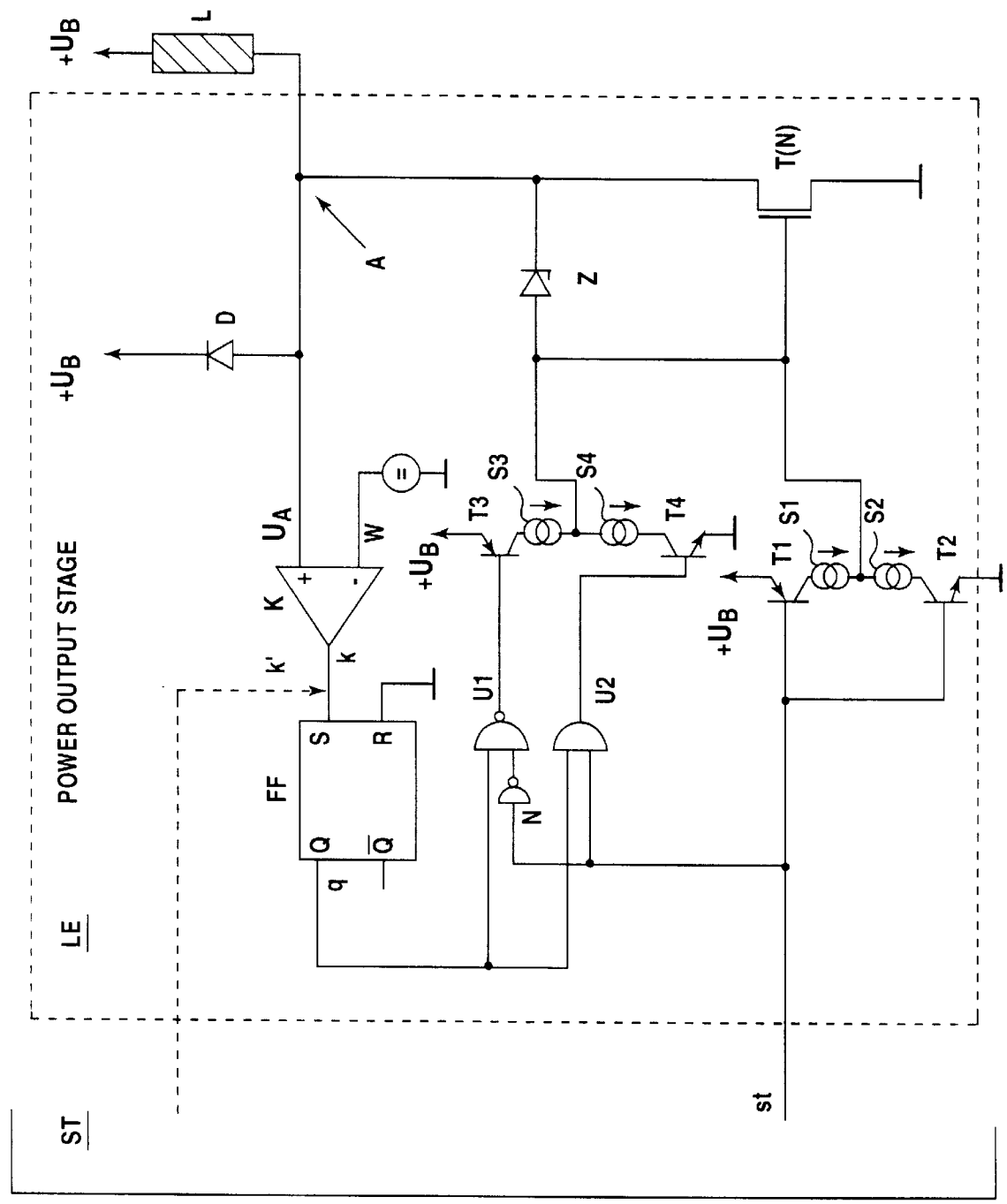
FIG. 3 is a circuit diagram of a third embodiment of the integrated power output stage.

The switches T and T1 to T4 illustrated schematically in the figure are presumed, in this illustrative embodiment, to be integrated MOSFET switches (T1 and T3 being P-channel MOSFETs, which are on when an L signal is applied to their control input, and T, T2 and T4 being N-channel MOSFETs, which are on when an H signal is applied to their control input), and T1 to T4 are to be taken as being switchable resistors which form an RC element with an input capacitor of the limit switch T. The driver switches T1 to T4 could (as an example) also be bipolar switches connected in series with one resistor R1–R4, as shown in FIG. 2, (which may be external on account of poor integrability) each or with one current source S1–S4, each as shown in FIG. 3.

The size of the current flowing through the control input of the limit switch T (from $+U_B$ or to GND) determines the speed at which the limit switch T turns on or off. In the drawing, the configuration, as P-channel or N-channel MOSFET switches, is put in brackets after the reference symbols of T and T1 to T4.

Using appropriate switching elements, the power output stage LE described can, of course, also be implemented in "inverted logic", in which the load is connected to the negative terminal GND and the limit switch T is a high-side switch.

A second driver is also provided, containing the driver switches T3 and T4 already mentioned, which are likewise connected in series between the positive terminal $+U_B$ and the negative terminal GND of the on-board voltage supply and are driven by the switching logic circuit described. A control input of the driver switch T3 is connected to an output of the NAND gate U1, while a control input of the driver switch T4 is connected to an output of the AND gate U2. A junction point between the two driver switches T3 and T4 is, like that for the first driver, connected to the control input of the limit switch T.

In this illustrative embodiment, the control signal st is an inverted signal, i.e. the limit switch T is meant to be on when st=L, and is meant to be off when st=H.

If the output signal q from the RS flipflop FF is q=L, then there is an H signal at the output of the NAND gate U1 and an L signal at the output of the AND gate U2. The two driver switches T3 and T4 are off. When a control signal st=L appears, driver switch T1 turns on and driver switch T2 turns off, which results in that the limit switch T is driven with a current (from $+U_B$ via T1) which turns it on with a shallow rising edge. When the control signal st=L disappears, driver switch T1 turns off and driver switch T2 turns on, which results in that the limit switch T turns off again with a shallow falling edge.

If the output signal q from the RS flipflop FF is q=H, then, when a control signal st=L appears, the driver switches T1 and T3 are simultaneously connected in parallel and turn on, which results in that the limit switch T is driven with a higher current than described previously for q=L (since T1 and T3 are now in parallel, with a lower total resistance), the limit switch T turning on with a steep rising edge. When the control signal disappears (st=H), the driver switches T1 and T3 turn off (the output of the NAND gate U1 goes to an H signal on account of the inverter N). The driver switches T2 and T4, which are now connected in parallel, thus turn on, and the limit switch T turns off with a steep falling edge.

The power output stage LE described is suitable not only for inductive loads but also for resistive loads. In this case, the threshold value W is not exceeded when the load L is first disconnected after the start of operation, and the load is accordingly driven with shallow edges.

I claim:

1. A method for driving an integrated power output stage having a limit switch for switching a load connected to terminals of a voltage source in series with the limit switch, a control unit generates control signals for driving the integrated power output stage, the method which comprises:

measuring a voltage at a junction point between the load and the limit switch if the load is disconnected resulting in a measured voltage;

comparing the measured voltage with a predetermined threshold value resulting in a comparison result;

storing a value associated with the comparison result over a course of operation;

turning on and off the limit switch to have shallow turn-on and turn-off edges with a first predetermined current when the value has a first, low signal level; and turning on and off the limit switch to have steep turn-on and turn-off edges with a second current if the value has a second, high signal level, the second current being a higher current than the first predetermined current.

2. The method according to claim 1, which comprises connecting a freewheeling diode between the junction point and a positive terminal of the voltage source for limiting the voltage at the junction point.

3. In combination with a control unit supplying a control signal and having an on-board voltage supply with a positive terminal and a negative terminal, a device for switching a load, comprising:

a limit switch having a control input and connected to the load;

a first driver having two driver switches including a first driver switch and a second driver switch connected in series with each other at a junction point and connected between the positive terminal and the negative terminal of the on-board voltage supply, said driver switches having control inputs receiving the control signal and said junction point of said driver switches connected to said control input of said limit switch;

a comparator having a first input connected to a junction point between the load and said limit switch, a second input receiving a threshold value, and an output;

an RS flipflop having a Set input connected to said output of said comparator, a Reset input connected to the negative terminal, and an output;

a switching logic circuit having a NAND gate with a first input, a second input, and an output, an AND gate with a first input, a second input, and an output, and an inverter with an input and an output, said output of said RS flipflop connected to said first input of said NAND gate and said first input of said AND gate, and the control signal received by said second input of said AND gate directly and to said second input of said NAND gate via said inverter; and a second driver having two driver switches, including a first driver switch and a second driver switch connected in series between the positive terminal and the negative terminal of the on-board voltage supply, said first driver switch of said second driver having a control input connected to said output of said NAND gate, said second driver switch of said second driver having a control input connected to said output of said AND gate, and a junction point between the two driver switches of said second driver connected to said control input of said limit switch.

4. The device according to claim 3, wherein said limit switch and said driver switches of said first driver and said second driver are integrated MOSFET switches.

5. The device according to claim 4, wherein said first driver switch of said first driver and said first driver switch of said second driver are P-channel MOSFETs, and said limit switch, said second driver switch of said first driver, and said second driver switch of said second driver are N-channel MOSFETs.

6. The device according to claim 3, including a plurality of resistors, said driver switches of said first driver and said second driver are bipolar transistors, and each of said bipolar transistors have one of said resistors connected in series with it.

7. The device according to claim 3, including a plurality of current sources, said driver switches of said first driver and said second driver are bipolar transistors, and each of said bipolar transistors have one of said current sources connected in series with it.

8. The device according to claim 3, wherein the control unit has an output delivering an output signal, and said Set input of said RS flipflop is connected to the output of the control unit and receives the output signal.

9. The device according to claim 3, wherein the control unit has outputs supplying driving signals having an amplitude associated with a desired steepness for turn-on and turn-off edges of said limit switch, and said control input of said driver switches of said second driver are directly connected to the outputs of the control unit for receiving the driving signals having the amplitude for controlling the desired steepness for the turn-on and turn-off edges of said limit switch.

* * * * *